United States Patent
Sandhu

[11] Patent Number: 5,517,133
[45] Date of Patent: May 14, 1996

[54] MULTIPLE-INPUT OR-GATE EMPLOYING A SENSE AMPLIFIER

[75] Inventor: Bal S. Sandhu, Fremont, Calif.

[73] Assignee: Sun Microsystems, Inc., Mountain View, Calif.

[21] Appl. No.: 92,388

[22] Filed: Jul. 14, 1993

[51] Int. Cl.$^6$ .................................................. H03K 19/094
[52] U.S. Cl. ........................... 326/121; 326/112; 326/108
[58] Field of Search ............................ 326/98, 108, 17, 326/121, 112; 327/53, 54, 434, 51, 77, 78, 80, 436, 437, 427

[56] References Cited

U.S. PATENT DOCUMENTS

| | | | |
|---|---|---|---|
| 4,728,827 | 1/1988 | Woo | 307/481 |
| 4,857,764 | 8/1989 | Young | 307/443 |
| 4,899,066 | 2/1990 | Aikawa et al. | 307/45.2 |
| 4,918,341 | 4/1990 | Galbraith et al. | 307/530 |
| 5,001,367 | 3/1991 | Vinal | 307/448 |
| 5,059,828 | 10/1991 | Tanagawa | 307/465 |
| 5,184,032 | 2/1993 | Leach | 307/443 |
| 5,408,145 | 4/1995 | Nguyen | 326/121 |

Primary Examiner—Edward P. Westin
Assistant Examiner—Stephen Calogeno
Attorney, Agent, or Firm—Blakely Sokoloff Taylor & Zafman

[57] ABSTRACT

The multiple-input OR-gate includes a set of pull down transistors connected in parallel to a common signal line. A pair of first and second inverters are connected along the common signal line between the input pull down transistors and an output. A feedback element connects an output of the second inverter to an input of the first inverter. The inverters are configured to maintain the input of the first inverter at a first intermediate voltage level of $V_{cc}-2$ Vt. Input signals received by the input transistors cause the voltage on the signal line to be pulled from the first intermediate level toward Vss. The first inverter responds by generating an output signal which swings from a low voltage of $V_{ss}$ towards a second intermediate level of $V_{cc}-0.7$ Vt. The second inverter responds by generating an output signal which swings between the high level of $V_{cc}$ and a low level of $V_{ss}$. The feedback element includes a time delay, whereby output signals provided by the second inverter are input to the first inverter subject to a time delay. Both method and apparatus embodiments of the invention are disclosed. Furthermore, a particular circuit embodiment is disclosed.

10 Claims, 5 Drawing Sheets

MULTIPLE-INPUT OR-GATE EMPLOYING A SENSE AMPLIFIER

BACKGROUND OF THE INVENTION

1. Field of the Invention

The invention generally relates to integrated circuits and in particular relates to a high-speed multiple-input complementary metal oxide semi-conductor (CMOS) OR-gate employing a sense amplifier.

2. Description of Related Art

Multiple-input OR-gate circuits are widely used in complex logic integrated circuit chips such as microprocessors and high speed comparators. A conventional multiple-input OR-gate employing five inputs is illustrated in FIG. 1. OR-gate 10 of FIG. 1 includes a set of five PMOS transistors $12_1$–$12_5$ connected in series and a set of five NMOS transistors $14_1$–$14_5$ connected in parallel to a common signal line 16. Input signals are received along five input lines i1–i5 with each input line connected to a PMOS transistor and a corresponding NMOS transistor. Specifically, input i1 is connected to both a gate of PMOS transistor $12_1$ and a gate of NMOS transistor $14_1$. Inputs i2–i5 are respectively connected to gates of PMOS transistors $12_2$–$12_5$ and gates of NMOS transistors $14_2$–$14_5$. Sources of each of the NMOS transistors 14 are connected to a ground. Drains of each of the NMOS transistors 14 are connected to common signal line 16. A source of PMOS transistor $12_1$ is connected to a voltage line at $V_{cc}$. A drain of transistor $12_5$ is connected to common signal line 16. The remaining sources and drains of PMOS transistors $12_1$–$12_5$ are connected in series, as shown. A single inverter 18 is connected to common line 16 for inverting and amplifying signals received along line 16 onto an output line 20 and to create the OR-function of input i1–i5.

Usually, a PMOS transistor must have a size three times greater than an NMOS transistor within the same circuit. With the configuration shown in FIG. 1, wherein the PMOS transistors are connected in series, each of the PMOS transistors must have a size fifteen times greater than that of corresponding NMOS transistors. For example, with each of the PMOS transistors having a channel ratio, defined as channel width over channel length in microns, of 5/0.8, each of the NMOS transistors should have a channel ratio of 75/0.8. As a result, the gate capacitance of the input signal lines is extremely high. Furthermore, because of fabrication constraints, the total silicon area required to achieve a reasonable switching speed using such large PMOS transistors is substantial. An increase in the number of input lines necessitates a corresponding increase in PMOS transistor size, resulting in still higher input gate capacitances and still greater silicon surface area requirements. As can be appreciated, the OR-gate configuration of FIG. 1 becomes less and less feasible with an increasing number of inputs.

To facilitate a greater number of inputs, an OR-gate configuration as illustrated in FIG. 2 has been proposed. FIG. 2 illustrates an OR-gate circuit 30 having a set of NMOS transistors, $32_1$–$32_{64}$, each having a source connected to a ground and a drain connected to a common signal line 36. The total of 64 input lines $i_1$–$i_{64}$ are provided with each input line connected to a gate of one of the NMOS transistors. Rather than providing a set of PMOS transistors in series, as in the configuration of FIG. 1, the circuit of FIG. 2 includes an additional NMOS transistor 38, a single PMOS transistor 40 and a pair of inverters 42 and 44, all connected along signal line 36. NMOS transistor 38 has a source and drain connected in series along line 36 and a gate connected to a Vcc voltage level. PMOS transistor 40 has a source connected to the Vcc voltage level, a drain connected to signal line 36 and a gate connected to a ground. NMOS transistor 38 is connected along signal line 36 between the input NMOS transistors $32_1$–$32_{64}$ and the drain connection of PMOS transistor 40. Further along signal line 36, inverters 42 and 44 are connected in series with an output of inverter 44 connected to an output line 46. Inverters 42 and 44 operate to both invert and amplify signals received along line 36 to provide a buffered OR output along line 46 having the same polarity as input line 36.

As can be seen from FIG. 2, only a single PMOS pull-up transistor is employed. Accordingly, both surface area and input gate capacitance is substantially less than that of the configuration of FIG. 1. For example, with input transistors $32_1$–$32_{64}$ each having a channel ratio of 5/0.8, pull-up PMOS transistor 40 may have a channel ratio of 15/0.8—substantially less than the 75/0.8 channel ratio required for each of the PMOS transistors required for the configuration of FIG. 1 which receives only five input lines, rather than sixty-four.

The provision of NMOS transistor 38 reduces an overall voltage swing occurring along signal line 36 by an amount Vtn, where Vtn is the threshold voltage for NMOS transistor 38. The reduction in voltage swing in turn facilitates operation of PMOS transistor 40 in pulling up the voltage along signal line 36 between NMOS transistor 38 and inverter 42 to $V_{cc}$.

Although the configuration of FIG. 2 presents a substantial improvement of that of FIG. 1, particularly for multiple-inputs, the circuit configuration of FIG. 2 has several possible disadvantages. A first disadvantage is that, although the size of PMOS transistor 40 is substantially less than that required in the configuration of FIG. 1, the size is still greater than would otherwise be desirable. The fairly large size of PMOS transistor 40 is required to facilitate the pull up of voltage towards $V_{cc}$ which, in turn, causes a high power dissipation by the overall circuit when any of the NMOS pull-down transistors 32 are active. That is, considerable power dissipation occurs whenever input signals are received along any of the input lines. A second disadvantage of the configuration of FIG. 2 is that a rise time occurring along signal line 36 between NMOS transistors 38 and inverter 42 is relatively slow because PMOS transistor 40 must first operate to pull up the voltage along signal line 36 prior to NMOS transistor 38 to a voltage level of $V_{cc}$–Vtn.

Pull-up along line 36 is required before NMOS transistor 38 becomes cut off and allows PMOS transistor 40 to pull up signal line 36 to the $V_{cc}$. Thus, although the multiple-input OR-gate circuit of FIG. 2 represents a substantial improvement over that of FIG. 1, the circuit of FIG. 2 is not ideal and several disadvantages are generally inherent in the configuration.

SUMMARY OF THE INVENTION

In view of the foregoing, it would be desirable to provide an improved multiple-input OR-gate. One of the general objects of the invention is to provide such an improved input OR-gate. A particular object of the invention is to provide an OR-gate circuit configured for effectively combining signals received along sixty-four or more input lines with minimal circuit size and complexity. It is a further object of the invention that the improved multiple-input OR-gate circuit be capable of high-speed operation. Further objects of the invention relate to providing improved circuitry for use in integrated circuit logic devices other than multiple-input OR-gates.

These objects and other general objects and advantages are achieved by a multiple-input OR-gate having:

a plurality of input transistor means, connected in parallel to a first signal line, for pulling down a voltage on the first signal line from a first intermediate voltage level toward a low voltage level, in response to received input signals;

a first inverter means, connected between the first signal line and second signal line, for pulling up a voltage on the second signal line from a low voltage toward a second intermediate voltage, in response to a change in voltage on along the first signal line;

a second inverter means, connected between the second signal line and an output line for pulling down a voltage on the output line from a high voltage level to a low voltage level, in response to a change in voltage on the second signal line; and a feedback means connecting an output of a second inverter means to tan input of the first inverter means for transmitting signals output from the second inverter means into the first inverter means and for delaying said signals therebetween.

In the preferred embodiment, the input transistor means is a set of NMOS transistors connected in parallel with a drain of each transistor connected to a common signal line, a source connected to a ground and a gate connected to an input signal line. The first and second inverter means are both inverter circuits. The feedback means is a feedback circuit having a single resistor and an NMOS transistor connected in series along a feedback line connecting an output of the second inverter to an input of the first inverter.

Preferably, the low voltage level is $V_{ss}$ and the high voltage level is $V_{cc}$. The first intermediate voltage is at a voltage level of $V_{cc}-2$ Vt and the second intermediate voltage is $V_{cc}-0.7$ Vt wherein Vt is a pre-selected voltage threshold value.

Collectively the first and second inverters and the feedback circuit comprise a sense amplifier which may be implemented in connection with other logical circuit elements besides multiple-input OR-gate elements.

In accordance with another embodiment, the invention provides a method for producing an output signal in response to any one of a plurality of input signals received along a plurality of input lines. The method comprises the steps of:

maintaining a common signal line at a first intermediate reference voltage level;

lowering a voltage on the common signal line toward a low reference voltage in response to an input signal;

producing a first intermediate input signal at a second intermediate reference voltage level if the common signal line is lowered from the first intermediate voltage level to the low voltage level, and maintaining the first intermediate signal level at the low voltage level otherwise;

producing an output signal at the low voltage level, if the first intermediate signal is at the second intermediate voltage level and producing an output signal at the high voltage level otherwise; and transmitting the output signal back to the signal line, with the signal transmitted back to the signal line being time delayed.

When embodied as either an apparatus or a method, the invention provides for high speed processing of input signals received along multiple-input lines, particularly for use in generating an OR-output based on the input signals. In particular, by exploiting various intermediate voltage levels, between a high $V_{cc}$ voltage level and a low $V_{ss}$ voltage level, the invention achieves high speed output, and, accordingly, is well suited for use in extremely high frequency integrated circuits. Furthermore, when embodied as an apparatus, the inverters of the apparatus may be fabricated using only a few PMOS transistors of relatively modest size, compared with the size of PMOS transistors required in most prior art multiple-input OR-gate circuits. As such, overall silicon surface area required for implementing the circuit is minimized and input capacitance is likewise minimized, further enhancing the high speed response to input signals.

DETAILED DESCRIPTION OF THE INVENTION

Figure 3:
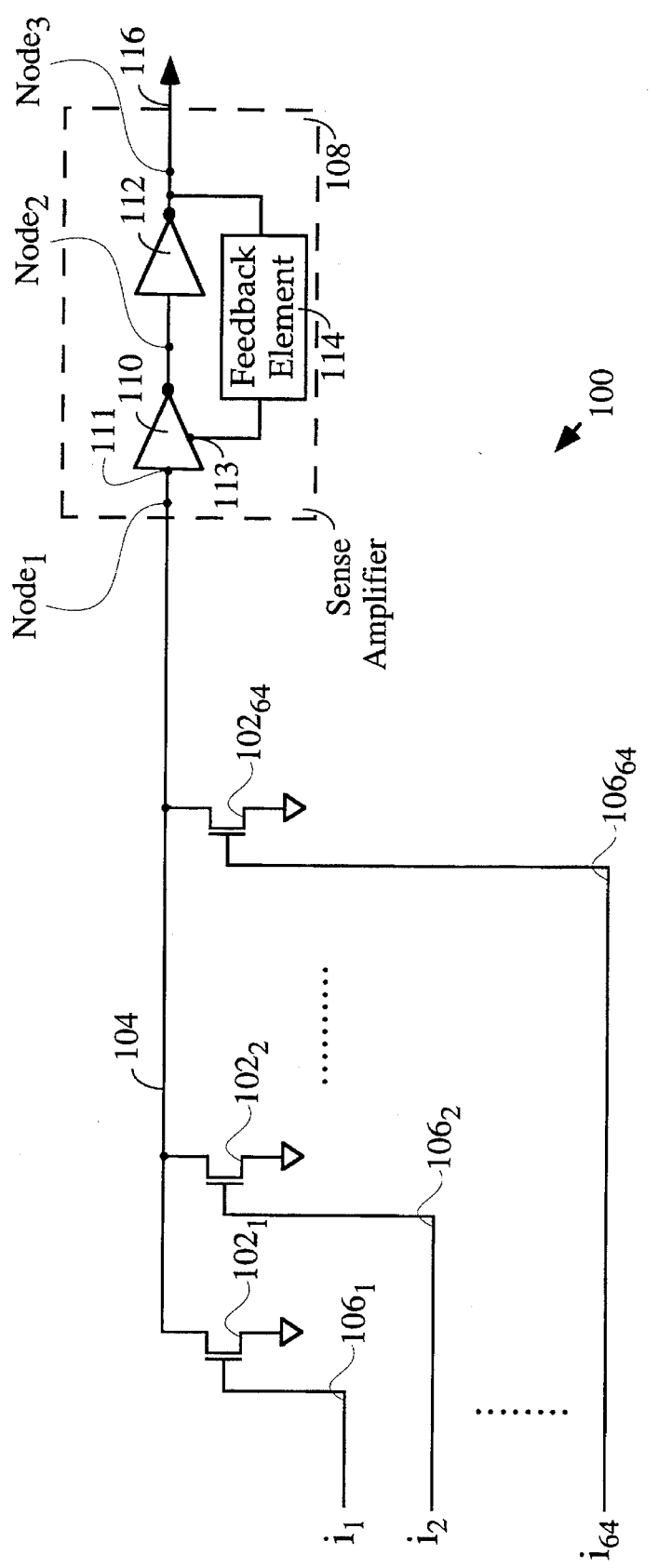
FIG. 3 is a schematic illustration of an improved multiple-input OR-gate circuit configured in accordance with a preferred embodiment of the invention.
Figure 4:
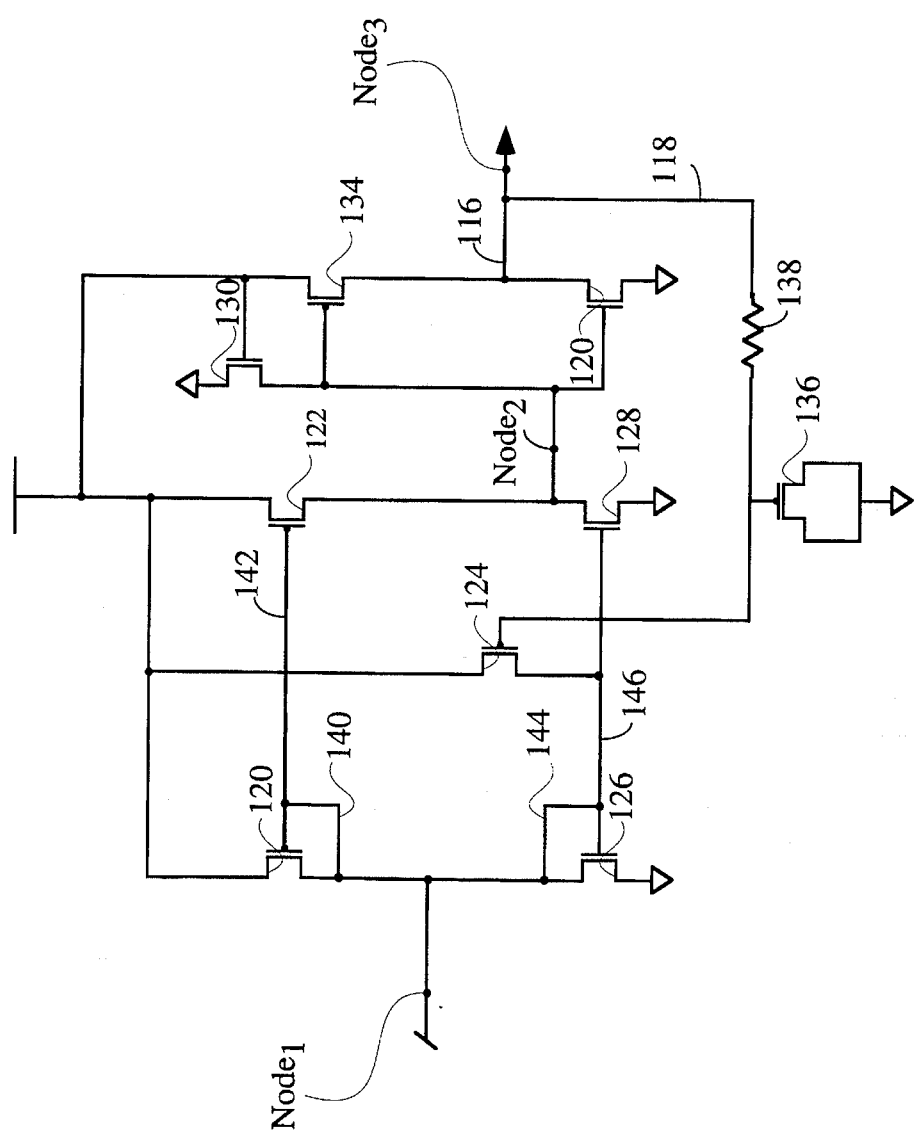
FIG. 4 is a schematic illustration of a sense amplifier of the multiple-input OR-gate circuit of FIG. 3.
Figure 5:
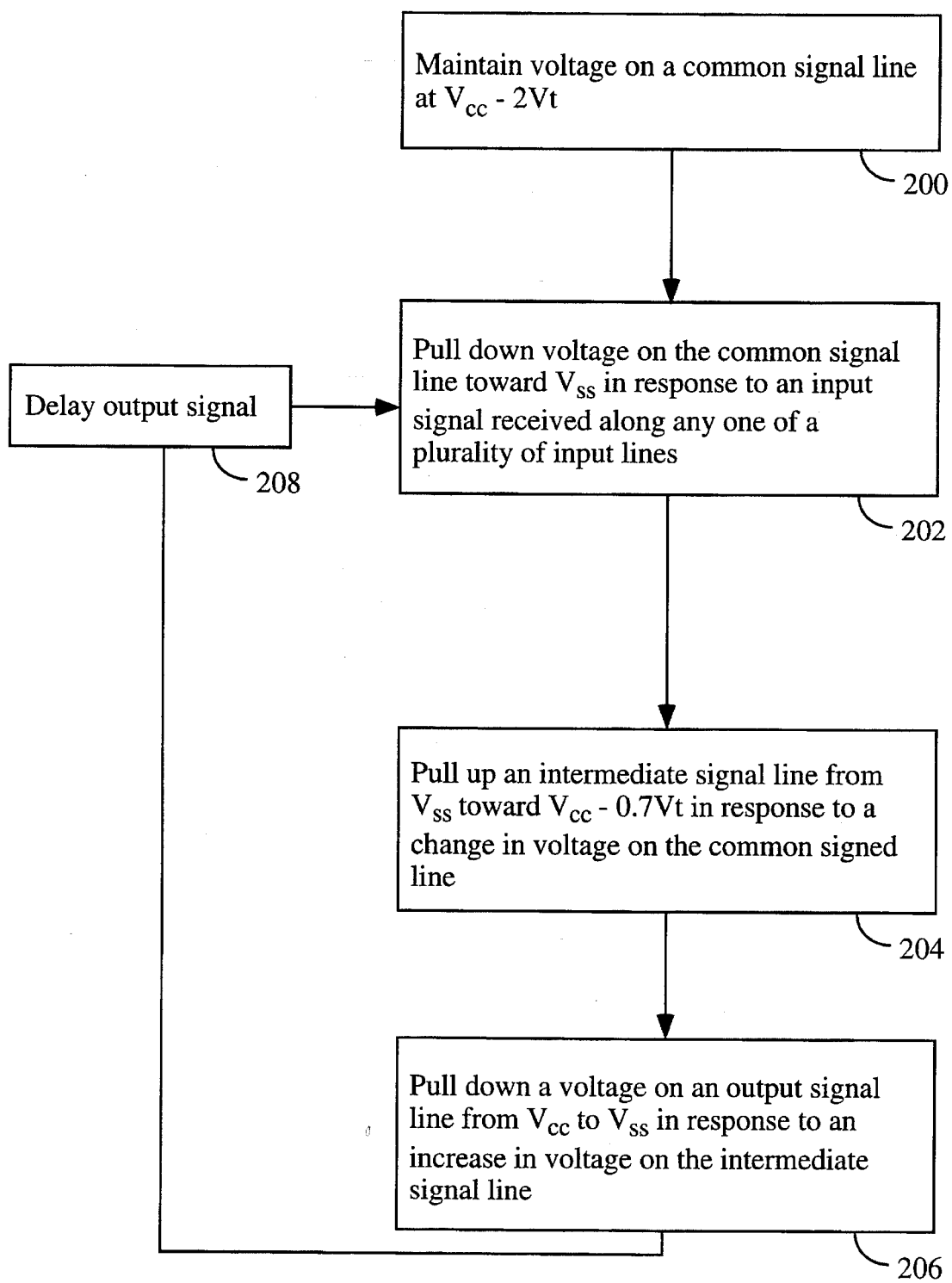
FIG. 5 is a block diagram illustrating a method of processing input signals to generate an OR-output provided in accordance with the invention.

Referring to FIGS. 3, 4 and 5, preferred embodiments of the invention will now be described. FIG. 3 illustrates a multiple-input OR-gate circuit 100 having a set of sixty-four NMOS input transistors $102_1$–$102_{64}$. Each of the input NMOS transistors includes a drain connected to a common signal line 104 and each includes a source connected to a voltage of $V_{ss}$, where $V_{ss}$ is a CMOS low voltage. Signals are received along input lines i1–i64, generally denoted as 106, with a gate of each of the NMOS transistors being connected to one of the input signal lines to yield an OR output.

Common signal line 104 is connected into a sense amplifier 108 which includes a first inverter 110 a second inverter 112, and a feedback element 114. Inverter 110 has a first input 111 connected to common signal line 104. An output of inverter 110 is connected into an input of inverter 112. An output signal line 116 connects an output of inverter 112 to other circuit components (not shown). Feedback element 114 is connected along a feedback transmission path 118 between the output of inverter 112 and a second input 113 of inverter 110. Hereinafter, the first input of inverter 110 is referred to as $node_1$, the output of inverter 110 and the input of inverter 112 are referred to as $node_2$, and the output of inverter 112 is referred to as $node_3$. In other words, inverter 110 interconnects $node_1$ and $node_2$, inverter 112 interconnects $node_2$ and $node_3$ and feedback element 114 connects $node_3$ and a second input 113 of inverter 110.

$Node_1$ is maintained at a first intermediate voltage level of $V_{cc}-2$ Vt where $V_{cc}$ is a CMOS high voltage and Vt is a transistor threshold voltage described in more detail below.

NMOS transistors 102 operate to pull down a voltage along line 104 from $V_{cc}-2$ Vt toward $V_{ss}$ in response to an input signal received along one or more of input lines 106. Hence, node$_1$ is pulled down from a first intermediate voltage of $V_{cc}-2$ Vt towards a low voltage of $V_{ss}$. Node$_2$ normally carries a voltage of $V_{ss}$. However, in response to a drop in voltage along node$_1$, inverter 110 operates to increase the voltage of node$_2$ toward a second intermediate voltage of, for example, $V_{cc}-0.7$ Vt. Node$_3$ is nominally held at the high CMOS voltage of $V_{cc}$. However, in response to an increase in voltage of node$_2$, inverter 112 operates to drop the voltage at node$_3$ to $V_{ss}$. Accordingly, the output signal provided along output line 116 swings between a nominal or inactive voltage of $V_{cc}$ and an active voltage of $V_{ss}$ with the nominal voltage indicating a lack of input and the active voltage indicating that an input signal has been received along one or more of input lines 106. By employing a pair of inverters, the polarity of signals received along input lines 106 is maintained at output 116. Furthermore, as will be described in more detail below, by exploiting the intermediate voltage levels, of $V_{cc}-2$ Vt and $V_{cc}-0.7$ Vt sense amplifier 108 is capable of responding very quickly to input signals to generate an output OR-signal. In particular, by biasing node$_1$ to a nominal voltage level of $V_{cc}-2$ Vt rather than $V_{cc}$, input NMOS transistors 102 pulls down node$_1$ fairly quickly toward a voltage level low enough to trigger operation of inverter 110. Likewise, by biasing node$_2$ to an intermediate voltage of $V_{cc}-0.7$ Vt, node$_1$ recovers quickly to its nominal voltage level, when all of the input signals are again inactive. The limited voltage swing along node$_2$ also allows inverter 112 to operate quickly in pulling down a voltage on output line 116 (node$_3$). Feedback circuit element 114 also assists in the recovery of voltage on node$_1$ to intermediate voltage $V_{cc}-2$ Vt, once all input lines 106 are again inactive. Accordingly, the overall circuit responds quickly to input signals received along any of input lines 106 to generate a buffered OR-output along output line 116.

A circuit schematic for sense amplifier 108 is provided in FIG. 4. Sense amplifier 108 includes a total of nine transistors with five transistors forming inverter 110, three forming inverter 112 and a single transistor, in combination with a single resistor, forming feedback element 114. More specifically, inverter 110 includes three PMOS transistors 120, 122 and 124 and two NMOS transistors 126 and 128. Inverter 112 includes a pair of NMOS transistors 130 and 132 and a single PMOS transistor 134. Feedback element 114 includes a single NMOS transistor 136 and a single resistor 138.

The various transistors of inverter 110 are connected in the following manner. PMOS transistor 120 has a drain connected to node$_1$ and a source connected to a high voltage level of $V_{cc}$. A line 140 interconnects a gate of transistor 120 to node$_1$. A line 142 connects the gate of transistor 120 to a gate of transistor 122. A source of transistor 122 is also connected to $V_{cc}$. A drain of transistor 122 is connected to node$_2$.

NMOS transistor 126 has a drain connected to node$_1$ and a source connected to a ground voltage of $V_{ss}$. A line 144 connects a gate of transistor 126 to node$_1$. NMOS transistor 128 has drain connected to node$_2$, a source connected to ground and a gate connected to a gate of transistor 126 via a line 146. PMOS transistor 124 has a source connected to $V_{cc}$, a drain connected to line 146 and a gate connected to an output of feedback circuit 114.

PMOS transistors 120 and 122 provide a Wilson current mirror. NMOS transistor 126 acts as a current source transistor for inverter 110. Transistors 122 and 128 provide a level shifter stage. Transistors 120 and 126 operate as current dividers. Transistors 132 and 134 operate as a buffer.

The sizes of PMOS transistors 120 and NMOS transistor 126 are chosen to set the DC-high level voltage of node$_1$ to about $V_{cc}-2$ Vt wherein Vt is the combined threshold of transistors 120 and 126. As noted above, by biasing node$_1$ to an inactive voltage of $V_{cc}-2$ Vt, high to low transition of node$_1$ is quite fast since node$_1$ does not have to swing from a full $V_{cc}$ to the trigger voltage of inverter 110.

The various transistors of inverter 112 are connected in the following manner. Input to inverter 112 is connected to a drain of NMOS transistor 130, a gate of PMOS transistor 134 and a gate of NMOS transistor 132. A source of NMOS transistor 130 is connected to a ground and a gate of transistor 130 is connected to the high voltage level $V_{cc}$. A drain of PMOS transistor 134 is connected to output line 116, (node$_3$). A drain of NMOS transistor 132 is also connected in node$_3$. A source of transistor 132 is connected to a ground.

The components of inverter 112 are configured to provide a low trip point so that once node$_1$ drops towards $V_{ss}$, causing node$_2$ to rise, the output of inverter 112 switches relatively fast from high $V_{cc}$ to low $V_{ss}$.

The output along line 116 is fed back into inverter 110 along feedback line 118 through resistor 138. A gate of NMOS transistor 136 is connected between and a gate of PMOS transistor 124 of inverter 110. Sources and drains of NMOS transistor 136 are both connected to a ground. In this manner, feedback element 114 acts as a delay element for providing a feedback delay into PMOS transistor 124 of inverter 110. In this manner, node$_1$, which had switched very quickly toward $V_{ss}$ from the first intermediate voltage level of $V_{cc}-2$ Vt is precharged up to a voltage level of, for example 400 milli-volts, to thereby speed up the recovery time node$_1$, when all of the input pull-down transistors 102 (FIG. 3) become inactive. By providing the time delay element, PMOS transistor 124 only becomes active after node$_1$ is pulled closer to $V_{ss}$ than the trip voltage of inverter 110.

It should be noted that, in use, the voltage on node$_1$ does not normally swing through the full range of $V_{cc}-2$ Vt down to $V_{ss}$. Rather, the voltage swings towards $V_{ss}$, but the voltage is pulled back towards $V_{cc}-2$ Vt after output node$_3$ reaches $V_{ss}$. The exact variation of voltage on node$_1$ depends, of course, on the particular sequence of input sequence received along input lines 106. Likewise, node$_2$ need not swing through a full range from $V_{ss}$ to $V_{cc}-0.7$ Vt. However, despite the intermediate voltage swings on node1 and node$_2$, the output (node$_3$) swings through the full CMOS voltage range of $V_{cc}/V_{ss}$ to allow complete compatibility with other circuit components (not shown).

Figure 1:
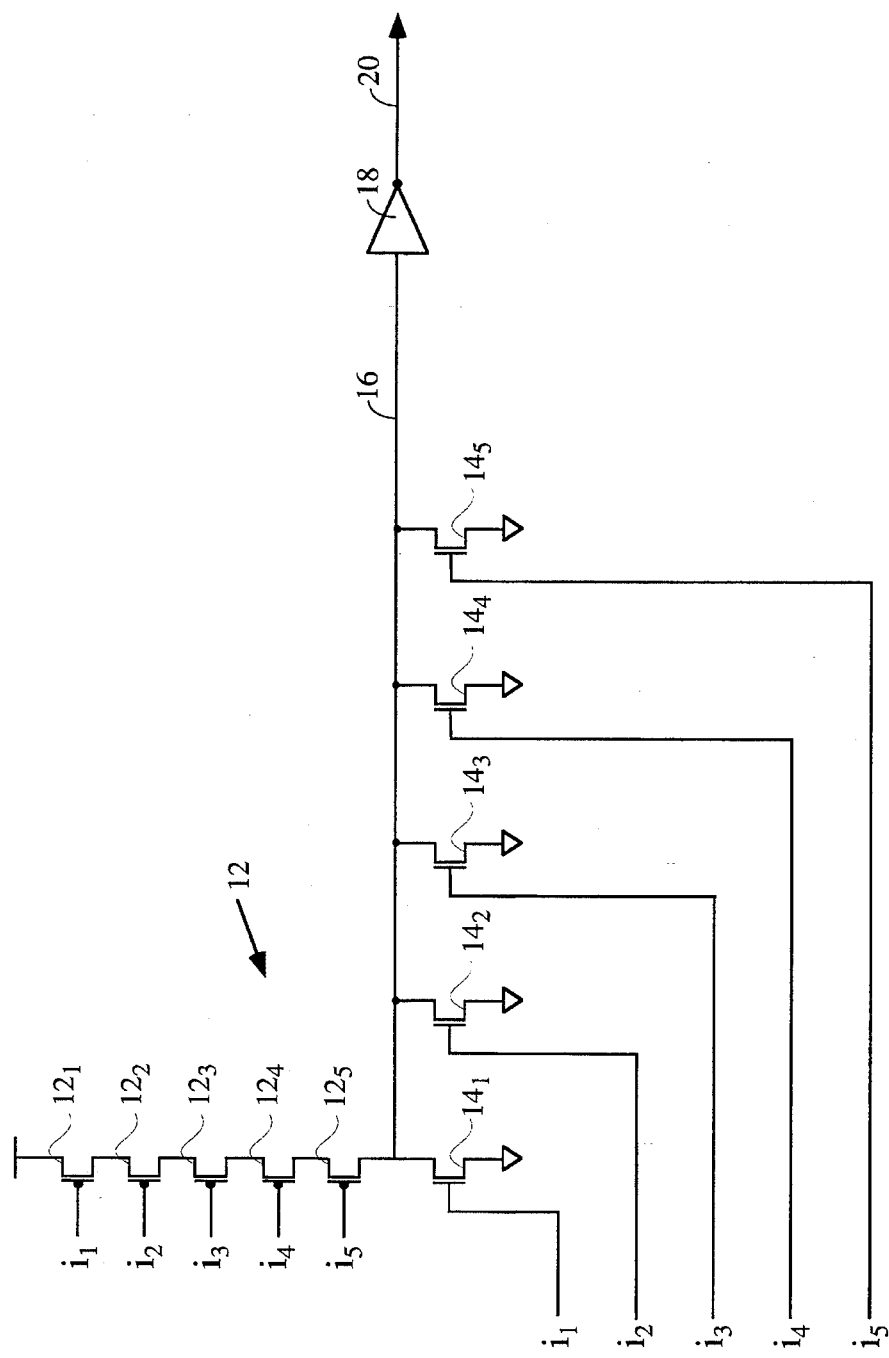
FIG. 1 provides a schematic illustration of a first prior art multiple-input OR-gate configured for receiving input signals along any of five input lines.
Figure 2:
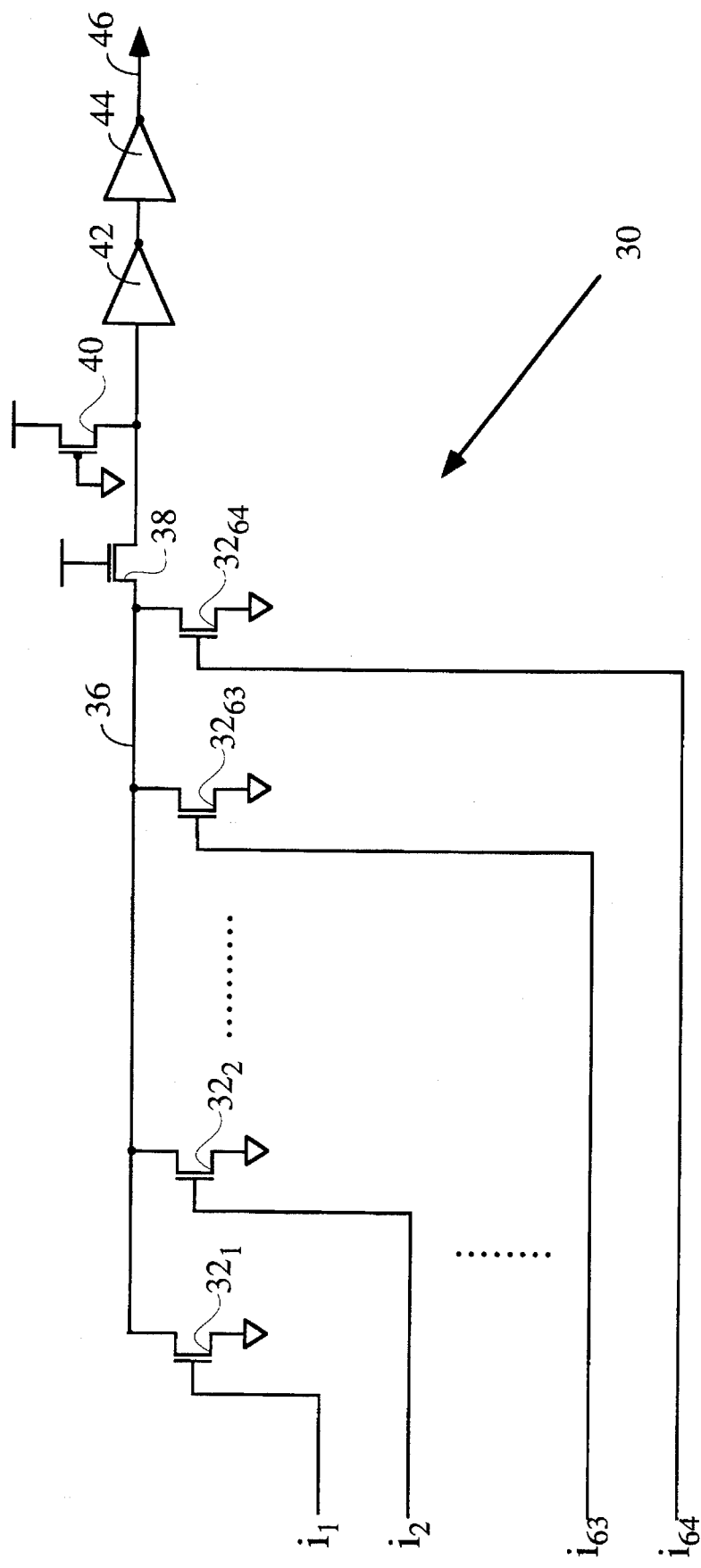
FIG. 2 is a schematic illustration of a second prior art multiple-input OR-gate circuit, configured for receiving signals of any of sixty-four input lines.

The multiple-input OR-gate circuit of the invention provides several possible advantages over previous circuits such as those illustrated in FIGS. 1 and 2. For example, the use of the current mirror (transistors 120 and 122) within inverter 110 provides good tracking over various process conditions, $V_{cc}$ levels and temperature levels. Transistors 120 and 126 can be fairly small in size such that DC power dissipation is very low when node$_1$ is at logic level $V_{cc}-2$ Vt. Furthermore, as noted above, the overall speed of sense amplifier 108 is quite fast since node$_1$ and node$_2$ only swing between intermediate voltage levels rather than a full $V_{cc}/V_{ss}$ voltage swing. Moreover, the layout area of sense amplifier 108 can be kept to a minimum.

The circuits illustrated in FIGS. 3 and 4 can be fabricated employing transistors and resistors having various values to achieve desired performance characteristics in accordance with particular circuit constraints. In the preferred embodiment described herein, the various transistors are configured to swing $node_1$ from the first intermediate voltage of $V_{cc}-2$ Vt toward $V_{ss}$ and to swing $node_2$ from $V_{ss}$ toward the second intermediate voltage of $V_{cc}-0.7$ Vt. However, other intermediate voltages may be achieved with appropriate selection of the sizes of the transistor components. A particular choice of intermediate voltage levels, may depend, in part, on overall circuit design constraints. Further, a second intermediate voltage value of $V_{cc}-0.7$ Vt is not necessarily an optimal intermediate level but rather represents an effective and preferred voltage level. In general, the highest voltage of $node_2$ should not be less than $V_{cc}-2$ Vtp wherein Vtp is the threshold voltage of transistor 134. Exemplary sizes for the various transistors, expressed in terms of channel width/length ratios, is provided in TABLE I. With a first value representing channel width in microns and a second value representing channel length in microns.

TABLE I

| Input NMOS transistors $102_1$–$102_{64}$ | 5/0.8 |
| --- | --- |
| PMOS transistor 120 | 3/0.8 |
| PMOS transistor 122 | 6/0.8 |
| NMOS transistor 126 | 2/4 |
| NMOS transistor 128 | 4/0.8 |
| PMOS transistor 124 | 6/0.8 |
| NMOS transistor 130 | 2/2 |
| PMOS transistor 134 | 20/0.8 |
| NMOS transistor 132 | 10/0.8 |
| NMOS transistor 136 | 10/5 |

As can be seen from TABLE I, all of the transistors are relatively small in size. Accordingly, input capacitance is small and overall power dissipation is relatively low, particularly, when no input signals are received along the input lines. As noted, the various transistor parameters may be selected in accordance with desired operational parameters and in view of any specific operating constraints imposed by a particular application. Moreover, although sense amplifier 108 is particularly useful in conjunction with a multiple-input OR-gate, sense amplifier 108 may be effective in other integrated circuitry as well, including, for example, random access memory.

The particular circuit embodiment illustrated in FIG. 4 is well suited for implementing the basic principles of the invention. However, other circuits may be configured in accordance with the general principles of the invention. A circuit illustrated in FIG. 4 is preferred since it provides a relatively simple layout requiring only a limited amount of silicon surface area.

Referring to FIG. 5, a method in accordance with the invention is set forth in block diagram form. The method may be employed using the circuits described in FIGS. 3 and 4 or using other circuit arrangements, as desired. The method illustrated in FIG. 5 provides for production of an output signal in response to any one of a plurality of input signals received along a plurality of input lines. Initially, at 200, a common signal line is maintained at a first intermediate reference voltage level of $V_{cc}-2$ Vt. Here the signal line is maintained at that intermediate voltage level as long as no signals are received along the input lines. At step 202, the voltage on the common signal line is lowered towards a low voltage of $V_{ss}$ in response to an input signal received along one of the input lines. At 204, a voltage on an intermediate signal line is pulled up toward $V_{cc}-0.7$ Vt, if the common signal line is lowered from $V_{cc}-2$ Vt towards $V_{ss}$. The intermediate signal is maintained at a low voltage of $V_{ss}$ otherwise. At 206, a voltage on an output signal line is pulled down from $V_{cc}$ to $V_{ss}$ in response to an increase in voltage on the intermediate signal line. More particularly, as the intermediate signal line is pulled up from $V_{ss}$ to $V_{cc}-0.7$ Vt, the voltage on the output line is pulled down. Hence, an output signal is produced at a low voltage level of $V_{ss}$ after a signal has been received on any of the input lines. An output signal is produced at a high voltage level of $V_{cc}$ otherwise. At 208, the output signal is transmitted back to the common signal line along a feedback loop. The feedback is time delayed.

Similarly to the apparatus embodiments of the invention, the method of the invention, described in FIG. 5, is effective, in part, because intermediate voltage levels are employed for intermediate inversion states of a multiple-input OR-gate signal. By employing intermediate voltages, the voltages need not be swung between the CMOS high level of $V_{cc}$ and the CMOS low level of $V_{ss}$. Overall processing speed is enhanced and input capacitance problems are minimized.

Whether embodied as a method or apparatus, the invention provides effective OR-gate logic for high speed processing of input signals. General principles of the invention are applicable in a variety of integrated circuits. The exemplary embodiments described herein are merely illustrative of the invention and do not limit the scope with which principles of the invention may be applied.

What is claimed is:

1. A multiple-input OR-gate comprising:

a plurality of input transistors means, each having a gate connected to a respective input line, a source connected to CMOS low $V_{ss}$, and a drain connected to a common line, said common line being held at a first intermediate reference voltage level while said gates are all open, for lowering a voltage on said common line to $V_{ss}$ in response to an input signal;

a first inverter means, having an input connected to said common line, for inverting signals received from said input transistors, said first inverter producing an output signal at a second intermediate reference voltage level if said common line swings from said first intermediate reference voltage level to said low voltage level and producing an output signal at $V_{ss}$ while said common line remains at said first intermediate reference voltage level;

a second inverter means, having an input connected to an output of said first inverter, for inverting output from said first inverter, said second inverter producing an output signal at $V_{ss}$ if said output from said first inverter swings from $V_{ss}$ to said second intermediate reference voltage level and producing an output signal at a high reference voltage level while said output of said first inverter remains at said second intermediate voltage level; and a feedback circuit means, connecting an output of said second inverter to a second input of said first inverter, for transmitting signals output from said second inverter into said second input of said first inverter, said feedback circuit having a delay element.

2. A multiple-input OR-gate comprising:

a plurality of input transistors means, each having a gate connected to a respective input line, a source connected to CMOS low $V_{ss}$, and a drain connected to a common line, said common line being held at a first intermediate reference voltage level while said gates are all open, for lowering a voltage on said common line to $V_{ss}$ in response to an input signal;

a first inverter means, having an input connected to said common line, for inverting signals received from said input transistors, said first inverter producing an output signal at a second intermediate reference voltage level if said common line swings from said first intermediate reference voltage level to $V_{ss}$ while said common line remains at said first intermediate reference voltage level;

a second inverter means, having an input connected to an output of said first inverter, for inverting output from said first inverter, said second inverter producing an output signal at $V_{ss}$ if said output from said first inverter swings from $V_{ss}$ to said second intermediate reference voltage level and producing an output signal at a high reference voltage level while said output of said first inverter remains at said second intermediate voltage level; and a feedback circuit means, connecting an output of said second inverter to a second input of said first inverter, for transmitting signals output from said second inverter into said second input of said first inverter, said feedback circuit having a delay element, wherein said high reference voltage level is CMOS high $V_{cc}$, said first intermediate reference voltage level is $V_{cc}-2$ Vt, and said second intermediate reference voltage level is $V_{cc}-0.7$ Vt, wherein Vt is a pre-selected voltage.

3. A multiple-input OR-gate comprising:

a plurality of input transistors, each having a gate connected to a respective input line, a source connected to CMOS low $V_{ss}$, and a drain connected to a common line, said common line being held at a first intermediate reference voltage level while said gates are all open, said common line being dropped to $V_{ss}$ while at least one of said gates of said transistors is closed;

a first inverter, having an input connected to said common line, for inverting signals received from said input transistors, said first inverter producing an output signal at a second intermediate reference voltage level if said common line swings from said first intermediate reference voltage level to $V_{ss}$ and producing an output signal at $V_{ss}$ while said common line remains at said first intermediate reference voltage level;

a second inverter, having an input connected to an output of said first inverter, for inverting output from said first inverter, said second inverter producing an output signal at $V_{ss}$ if said output from said first inverter swings from $V_{ss}$ to said second intermediate reference voltage level and producing an output signal at a high reference voltage level while said output of said first inverter remains at said second intermediate reference voltage level; and a feed back circuit, connecting an output of said second inverter to a second input of said first inverter, for transmitting signals output from said second inverter into said second input of said first inverter, said feedback circuit having a delay element.

4. A multiple-input OR-gate comprising:

a plurality of input transistors, each having a gate respective input line, a source connected to CMOS low $V_{ss}$, and a drain connected to a common line, said common line being held at a first intermediate reference voltage level while said gates are all open, said common line being dropped to $V_{ss}$ while at least one of said gates of said transistors is closed;

a first inverter, having an input connected to said common line, for inverting signals received from said input transistors, said first inverter producing an output signal at a second intermediate reference voltage level if said common line swings from said first intermediate reference voltage level to $V_{ss}$ and producing an output signal at $V_{ss}$ while said common line remains at said first intermediate reference voltage level;

a second inverter, having an input connected to an output of said first inverter, for inverting output from said first inverter, said second inverter producing an output signal at $V_{ss}$ if said output from said first inverter swings from $V_{ss}$ to said second intermediate reference voltage level and producing an output signal at a high reference voltage level while said output of said first inverter remains at said second intermediate reference voltage level; and a feedback circuit, connecting an output of said second inverter to a second input of said first inverter, for transmitting signals output from said second inverter into said second input of said first inverter, said feedback circuit having a delay element, wherein said high reference voltage level is CMOS high $V_{cc}$, said first intermediate reference voltage level is $V_{cc}-0.7$ Vt, wherein Vt is a pre-selected voltage.

5. A method for producing an output signal in response to any one of plurality of input signals received along a plurality of input lines, said method comprising:

maintaining a signal line at a first intermediate reference voltage level while no signals are received along said input lines, and lowering a voltage on said common line toward CMOS low $V_{ss}$ in response to an input signal;

producing an first intermediate signal at a second intermediate reference voltage level if said signal line is lowered from said first intermediate reference voltage level toward $V_{ss}$ and maintaining the first intermediate signal at $V_{ss}$ while said signal line remains at said first intermediate reference voltage level;

producing an output signal at $V_{ss}$ if the first intermediate signal is at said second intermediate reference voltage level and producing an output signal at a high reference voltage level other wise; and transmitting said output signal back to said signal line, said output signal transmitted back to said signal line being time-delayed.

6. A method for producing an output signal in response to any one of plurality of input signals received along a plurality of input lines, said method comprising:

passing said input signals through any of a plurality of input transistors means, each having a gate connected to a respective input line, a source coupled to CMOS low $V_{ss}$, and a drain connected to a common line, said common line being held at a first intermediate reference voltage level while said gates are all open, for lowering a voltage on said common line to $V_{ss}$ in response to an input signal;

passing a signal from said common line through a first inverter means, having an input connected to said common line, for inverting signals received from said input transistors, said first inverter producing an output signal at a second intermediate reference voltage level if said common line swings from said first intermediate reference voltage level to $V_{ss}$ and producing an output signal at $V_{ss}$ while said common line remains at said first intermediate reference voltage level;

passing an output signal from said first inverter through a second inverter means, having an input connected to an output of said first inverter, for inverting output from said first inverter, said second inverter producing an output signal at $V_{ss}$ if said output from said first inverter swings from $V_{ss}$ to said second intermediate reference voltage level and producing an output signal at a high reference voltage level while said output of said first inverter remains at said second intermediate reference voltage level; and passing an output of said second inverter through a feedback circuit means, connecting an output of said second inverter to a second input of said first inverter, for transmitting signals output from said second inverter into said second input of said first inverter, said feedback circuit having a delay element.

7. A multiple-input OR-gate comprising:

a plurality of inputs;

a plurality of transistors each having a gate coupled to a corresponding input, a drain coupled to a common line, and a source coupled to a low reference voltage;

a sense amplifier coupled to the common line for detecting a voltage of the common line, the sense amplifier comprising:
   a first PMOS transistor having a gate and a drain both coupled to the common line and a source coupled to a high reference voltage;
   a first NMOS transistor having a gate and a drain both coupled to the common line and a source coupled to the low reference voltage;
   a second PMOS transistor having a gate coupled to a first node, a drain coupled to an output, and a source coupled to the high reference voltage;
   a second NMOS transistor having a gate coupled to the first node, a drain coupled to the output, and a source coupled to the low reference voltage;
   a third PMOS transistor having a gate coupled to the gate of the first PMOS transistor, a drain coupled to the first node, and a source coupled to the high reference voltage;
   a third NMOS transistor having a gate coupled to the gate of the first NMOS transistor, a drain coupled to the first node, and a source coupled to the low reference voltage;
   a fourth NMOS transistor having a gate coupled to the high reference voltage, a source coupled to the low reference voltage, and a drain coupled to the first node;
   a fourth PMOS transistor having a gate, a drain coupled to the gate of the first NMOS transistor, and a source coupled to the high reference voltage; and
   a feedback circuit coupled between the output and the gate of the fourth PMOS transistor.

8. The multiple-input OR-gate of claim 7, wherein the feedback circuit comprises:

a resistor coupled in series between the output and the gate of the fourth PMOS transistor; and a capacitor coupled between the gate of the fourth PMOS transistor and ground.

9. The multiple-input OR-gate of claim 8, wherein the capacitor is a fifth PMOS transistor having a gate coupled to the gate of the fourth PMOS transistor and a drain and a source both coupled to the low reference voltage.

10. The multiple-input OR-gate of claim 7, the low reference voltage being CMOS low $V_{ss}$ and the high reference voltage being CMOS high $V_{cc}$, wherein the voltage of the common line swings between $V_{ss}$ and $V_{cc}-2\,Vt$ and a voltage of the first node swings between $V_{ss}$ and $V_{cc}-0.7\,Vt$, Vt being a predefined voltage.

* * * * *

UNITED STATES PATENT AND TRADEMARK OFFICE
CERTIFICATE OF CORRECTION

PATENT NO.   : 5,517,133
DATED        : May 14, 1996
INVENTOR(S)  : Bal S. Sandhu It is certified that an error appears in the above-identified patent and that said Letters Patent is hereby corrected as shown below:

In column 9, in claim 2 at line 6, please delete " to " and insert -- to $V_{SS}$ and producing an output signal at --.

In column 9, in claim 4 at line 58, please delete " gate " and insert -- gate connected to a --.

In column 10, in claim 4 at line 22, please delete " is " and insert -- is $V_{CC}$ -2 Vt, and said second intermediate reference voltage level is --.

Signed and Sealed this

Twenty-ninth Day of October 1996

Attest:

BRUCE LEHMAN

*Attesting Officer*   *Commissioner of Patents and Trademarks*